US012772815B2

(12) United States Patent
Yuan et al.

(10) Patent No.: US 12,772,815 B2
(45) Date of Patent: Oct. 20, 2026

(54) CONTACT FILLING METHOD

(71) Applicant: Shanghai Huali Integrated Circuit Corporation, Shanghai (CN)

(72) Inventors: Zhiqi Yuan, Shanghai (CN); Jiazhang Xu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 303 days.

(21) Appl. No.: 18/810,398

(22) Filed: Aug. 20, 2024

(65) Prior Publication Data

US 2025/0105060 A1 Mar. 27, 2025

(30) Foreign Application Priority Data

Sep. 26, 2023 (CN) ........................ 202311255831.9

(51) Int. Cl.
*H10W 20/00* (2026.01)
*H10W 20/47* (2026.01)

(52) U.S. Cl.
CPC ....... *H10W 20/057* (2026.01); *H10W 20/081* (2026.01); *H10W 20/47* (2026.01)

(58) Field of Classification Search
CPC . H10W 20/057; H10W 20/081; H10W 20/47; H10W 20/033; H10W 20/425
See application file for complete search history.

(56) References Cited

U.S. PATENT DOCUMENTS

| | | | | |
|---|---|---|---|---|
| 6,380,084 | B1 * | 4/2002 | Lim | H10P 14/412 257/E21.585 |
| 9,281,276 | B2 * | 3/2016 | Usami | H10P 14/6334 |
| 9,559,052 | B2 * | 1/2017 | Usami | H10P 14/6334 |
| 11,410,889 | B2 * | 8/2022 | Wang | H10D 84/0177 |
| 12,315,734 | B2 * | 5/2025 | Lin | H10B 12/482 |
| 12,424,451 | B2 * | 9/2025 | Xu | H10D 64/0112 |
| 2015/0228586 | A1 * | 8/2015 | Usami | H10P 14/6334 438/643 |
| 2016/0172298 | A1 * | 6/2016 | Usami | H10P 14/6334 438/624 |
| 2017/0110399 | A1 * | 4/2017 | Usami | H10P 14/6334 |
| 2017/0287779 | A1 * | 10/2017 | Huang | H10W 20/033 |
| 2020/0098623 | A1 * | 3/2020 | Cheng | H10D 30/62 |
| 2021/0028139 | A1 * | 1/2021 | Xu | H10D 64/0112 |

(Continued)

FOREIGN PATENT DOCUMENTS

| | | | | |
|---|---|---|---|---|
| CN | 1484856 A | * | 3/2004 | H10P 14/46 |
| CN | 1322572 C | * | 6/2007 | H10P 14/46 |

(Continued)

*Primary Examiner* — Laura M Menz
(74) *Attorney, Agent, or Firm* — Quarles & Brady LLP

(57) ABSTRACT

The present disclosure provides a contact filling method, removing the second oxide layer and the second SiN layer above the first oxide layer on the side provided with no Co layer, until an upper surface of the TiN layer is exposed, so as to form a first contact; removing the second oxide layer and first SiN layer above the first oxide layer on the side provided with the Co layer by etching, until the upper surface of the Co layer is exposed, so as to form a second contact; forming a selective Co layer on the TiN layer at the bottom of the first contact and on the Co layer at the bottom of the second contact respectively; and filling the first contact and the second contact with tungsten respectively.

7 Claims, 3 Drawing Sheets

(56) References Cited

U.S. PATENT DOCUMENTS

| | | | | |
|---|---|---|---|---|
| 2021/0193511 | A1* | 6/2021 | Wang | H10P 70/234 |
| 2022/0139773 | A1* | 5/2022 | Wang | H10P 70/234 257/774 |
| 2023/0135172 | A1* | 5/2023 | Wang | B82Y 10/00 438/396 |
| 2024/0105464 | A1* | 3/2024 | Xu | H10D 64/0112 |
| 2024/0387253 | A1* | 11/2024 | Wang | B82Y 10/00 |
| 2025/0105060 | A1* | 3/2025 | Yuan | H10W 20/033 |

FOREIGN PATENT DOCUMENTS

| | | | | | |
|---|---|---|---|---|---|
| CN | 109994421 | B | * | 8/2021 | H10P 50/283 |
| CN | 116782640 | A | * | 9/2023 | H10B 12/01 |
| CN | 117153772 | A | * | 10/2023 | H10P 50/73 |
| CN | 117832165 | A | * | 4/2024 | H10P 95/062 |
| CN | 119725219 | A | * | 3/2025 | H10W 20/081 |
| WO | WO-2015068251 | A1 | * | 5/2015 | H10P 95/00 |

* cited by examiner

CONTACT FILLING METHOD

CROSS-REFERENCE TO RELATED APPLICATIONS

This application claims priority to Chinese patent application No. 202311255831.9, filed on Sep. 26, 2023, the disclosure of which is incorporated herein by reference in its entirety.

TECHNICAL FIELD

The present disclosure relates to the technical field of semiconductors, and in particular to a contact filling method.

BACKGROUND

In the existing contact V0 process, filling is performed with titanium Ti, titanium nitride TiN, and tungsten W in sequence. Due to the presence of a barrier layer and a nucleation layer Nuc, a contact resistance of the contact V0 process is high, affecting the device performance.

A developing filling method is direct filling with pretreatment and selective tungsten, which can greatly reduce the contact resistance of the contact V0 and improve the device performance. However, a high resistance trench (HR trench) and a metal layer trench (M0 trench) Co are present during filling of a wafer of the existing contact V0 process, where the bottom of the HR trench is TiN, and the bottom of the metal layer trench is Co. A nucleation point of tungsten provided by the pretreatment can achieve good selective growth of the M0 trench. However, since the bottom of the HR trench is TiN, the incubation time of selective W on TiN is the same as that of silicon oxide, failing to achieve the condition for the selective growth. Moreover, after the pretreatment and a selective tungsten deposition process, the TIN at the bottom of the HR trench may be damaged, thus causing a high resistance problem.

The existing solution is adding a cap layer (SiN and oxide) on the TIN at the bottom of the HR trench. This method not only increases the number of integration processes (2 times of deposition, 1 time of etching, and 1 time of wet etching), but also increases the difficulty in etching control of an etch stop layer of the HR trench due to the increase in a stack of film layers, and affects a process window. In addition, the wet etching of the etch stop layer imposes a large impact on the defect performance.

BRIEF SUMMARY

The present disclosure provides a contact filling method, at least including:

- step I, providing a first oxide layer, wherein a Co layer embedded in the first oxide layer is formed on one side of the first oxide layer, and the Co layer penetrates through upper and lower surfaces of the first oxide layer; forming a stack layer on upper surfaces of the first oxide layer and the Co layer, wherein the stack layer comprises a first SiN layer, a TiN layer, and a second SiN layer in sequence from bottom to top;
- step II, removing the second SiN layer and the TiN layer above the first oxide layer on one side provided with the Co layer by etching, and then covering, with the second oxide layer, the second SiN layer above the first oxide layer on one side provided with no Co layer and the first SiN layer on the side of the first oxide layer that is provided with the Co layer;

- step III, removing the second oxide layer and the second SiN layer above the first oxide layer on the side provided with no Co layer by development etching, until an upper surface of the TiN layer is exposed, so as to form a first contact, wherein the TiN layer acts as the bottom of the first contact, and the diameter of the first contact is less than the width of the first oxide layer;
- step IV, removing the second oxide layer and first SiN layer above the first oxide layer on the side provided with the Co layer by development etching, until the upper surface of the Co layer is exposed, so as to form a second contact, wherein the diameter of the second contact is less than the width of the Co layer;
- step V, forming a selective Co layer on the TiN layer at the bottom of the first contact and on the Co layer at the bottom of the second contact respectively; and
- step VI, filling the first contact and the second contact with tungsten respectively.

In some examples, the width of the first oxide layer in step II is a width in a lateral plane.

In some examples, the width of the Co layer in step IV is a width in a lateral plane.

In some examples, the selective Co layer is formed on the TiN layer at the bottom of the first contact and on the Co layer at the bottom of the second contact respectively in step V using a selective deposition method.

In some examples, the first contact and the second contact are filled with tungsten respectively in step VI using a selective deposition method.

In some examples, the selective Co layer formed on the TiN layer at the bottom of the first contact in step V is used to protect the TiN layer at the bottom of the first contact from damage and to avoid high resistance phenomena.

In some examples, the selective Co layer is formed on the TiN layer at the bottom of the first contact and on the Co layer at the bottom of the second contact respectively in step V in the same process.

As described above, the contact filling method of the present disclosure has the following beneficial effects: the present disclosure solves the problem that selective tungsten cannot be grown in a high resistance trench (HR trench). Regarding the pretreatment, there is no need to take into account a loss of TiN, so that the process is more tunable. Regarding the integration, only a thin film deposition step is added, which has a small impact. The selective tungsten can be formed, greatly reducing the contact V0 resistance, and improving device performance.

DETAILED DESCRIPTION OF THE DISCLOSURE

The embodiments of the present disclosure are described below using specific examples, and those skilled in the art could readily understand other advantages and effects of the present disclosure from the contents disclosed in the description. The present disclosure can also be implemented or applied using other different specific implementations, and various details in the description can also be modified or changed based on different viewpoints and disclosures without departing from the spirit of the present disclosure.

References are made to FIGS. 1 to 4. It should be noted that the drawings provided in the embodiments are only used to illustrate the basic concept of the present disclosure in a schematic way, so the drawings only show the components related to the present disclosure rather than being drawn according to the number, shape, and size of the components in actual implementations. The type, number, and proportion of various components can be changed randomly in the actual implementations, and the layout of the components may be more complicated.

Figure 4:
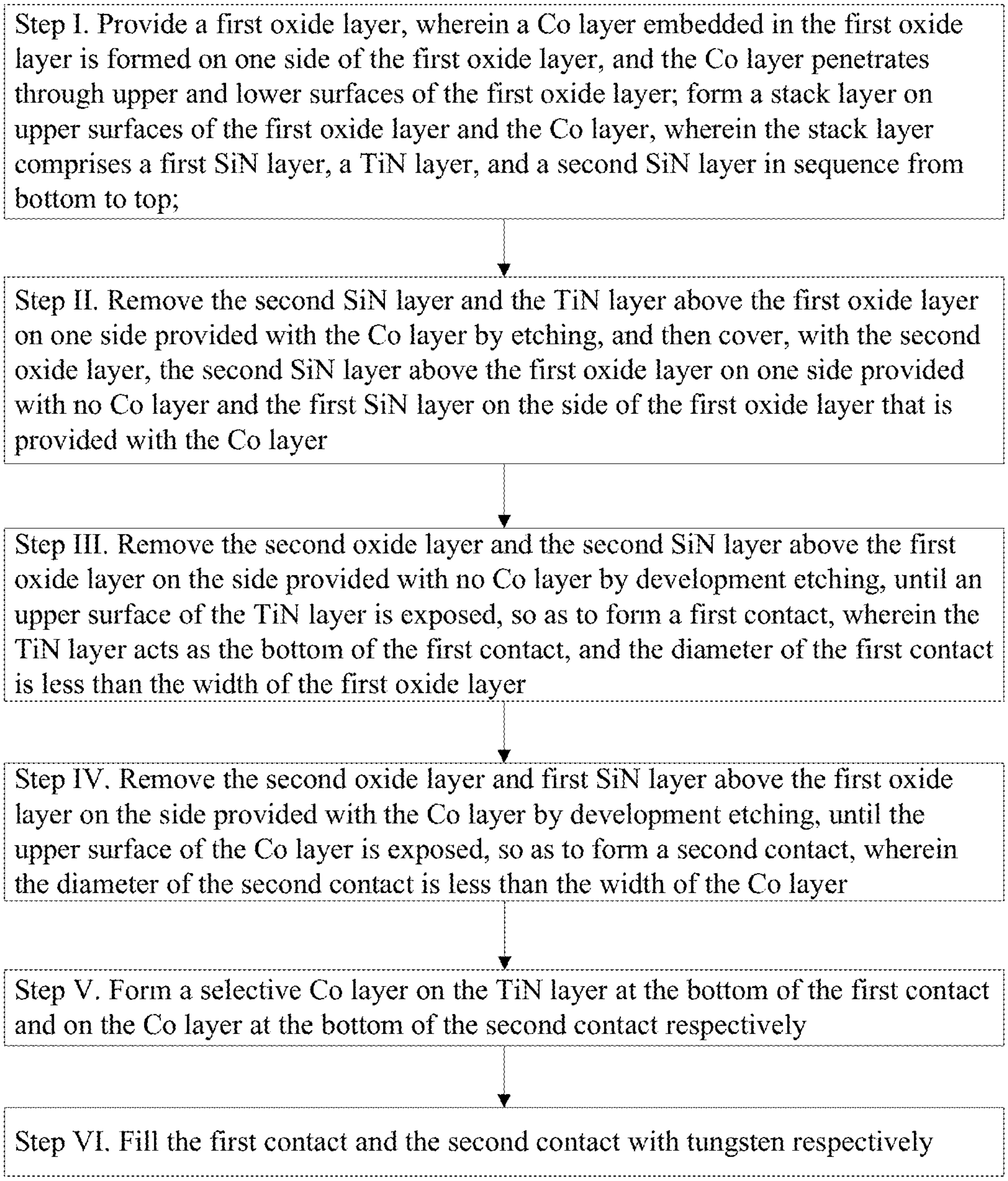
FIG. 4 illustrates a flowchart of a contact filling method in the present disclosure.

The present disclosure provides a contact filling method. Referring to FIG. 4, FIG. 4 illustrates a flowchart of the contact filling method in the present disclosure. The method at least includes the following steps.

Figure 1:
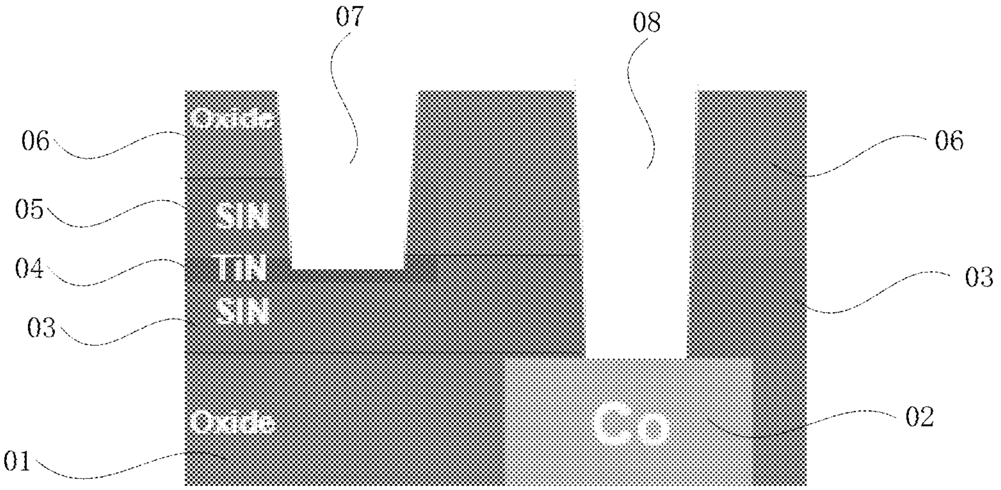
FIG. 1 illustrates a schematic diagram of a structure in which a first contact and a second contact are formed in the present disclosure.

Step I. A first oxide layer is provided, wherein a Co layer embedded in the first oxide layer is formed on one side of the first oxide layer, and the Co layer penetrates through upper and lower surfaces of the first oxide layer; a stack layer is formed on upper surfaces of the first oxide layer and the Co layer, wherein the stack layer comprises a first SiN layer, a TiN layer, and a second SiN layer in sequence from bottom to top. Referring to FIG. 1, FIG. 1 illustrates a schematic diagram of a structure in which a first contact and a second contact are formed in the present disclosure. The first contact in the present disclosure is also referred to as a high resistance trench, and the second contact is also referred to as a metal layer trench.

In step I, the first oxide layer 01 is provided, wherein the Co layer 02 embedded in the first oxide layer 01 is formed on one side of the first oxide layer 01, and the Co layer 02 penetrates through upper and lower surfaces of the first oxide layer 01; and then the stack layer is formed on upper surfaces of the first oxide layer 01 and the Co layer 02, wherein the stack layer includes the first SiN layer 03, the TiN layer 04, and the second SiN layer 05 in sequence from bottom to top. The first SiN layer 03, the TiN layer 04, and the second SiN layer 05 in FIG. 1 have been etched, and FIG. 1 does not show the first SiN layer 03, TiN layer 04, and second SiN layer 05 not etched. Therefore, the first SiN layer 03, the TiN layer 04, and then second SiN layer 05 in step I are not etched. In step I, the second oxide layer 06 is formed on the stack layer after forming the stack layer. The second oxide layer 06 in FIG. 1 has been etched, and FIG. 1 does not show the second oxide layer 06 not etched. Therefore, the second oxide layer 06 in step I is not etched.

Step II. The second SiN layer and the TiN layer above the first oxide layer on one side provided with the Co layer are removed by etching, and then the second SiN layer above the first oxide layer on one side provided with no Co layer and the first SiN layer on the side of the first oxide layer that is provided with the Co layer are covered with the second oxide layer.

Furthermore, in this embodiment of the present disclosure, the width of the first oxide layer in step II is a width in a lateral plane.

In step II, the second SiN layer 05 and the TiN layer 04 above the first oxide layer 01 on the side provided with the Co layer 02 are removed by etching, and then the second SiN layer 05 above the first oxide layer 01 on the side provided with no Co layer and the first SiN layer 03 on the side of the first oxide layer 01 that is provided with the Co layer are covered with the second oxide layer 06.

In this embodiment, the width of the first oxide layer is the width in the lateral plane. In this embodiment, the first oxide layer is disposed on a wafer, and the width thereof in the lateral plane refers to the width of a wafer plane occupied thereby.

Step III. The second oxide layer and the second SiN layer above the first oxide layer on the side provided with no Co layer are removed by development etching, until an upper surface of the TiN layer is exposed, so as to form a first contact, wherein the TiN layer acts as the bottom of the first contact, and the diameter of the first contact is less than the width of the first oxide layer. The diameter of the first contact 07 being less than the width of the first oxide layer 01, indicates that the diameter of the first contact 07 here refers to the diameter of the bottom of the first contact. In step III, the second oxide layer 06 and the second SiN layer 05 above the first oxide layer 01 on the side provided with no Co layer are removed by development etching, until the upper surface of the TiN layer 04 is exposed, so as to form the first contact 07, wherein the TiN layer 04 acts as the bottom of the first contact 07, and the diameter of the first contact 07 is less than the width of the first oxide layer 01.

Step IV. The second oxide layer and first SiN layer above the first oxide layer on the side provided with the Co layer are removed by development etching, until the upper surface of the Co layer is exposed, so as to form a second contact, wherein the diameter of the second contact is less than the width of the Co layer. Referring to FIG. 1, in step IV, the second oxide layer 06 and first SiN layer 03 above the first oxide layer 01 on the side provided with the Co layer are etched sequentially upon development, until the upper surface of the Co layer 02 is exposed, so as to form the second contact 08, wherein the diameter of the second contact 08 is less than the width of the Co layer 02. Furthermore, in this embodiment of the present disclosure, the width of the Co layer 02 in step IV is a width in a lateral plane. That is, the diameter of the second contact 08 herein refers to the diameter of the bottom of the second contact 08. In this embodiment, the width of the Co layer 02 is the width in the lateral plane. In this embodiment, the Co layer 02 is disposed on a wafer, and the width thereof in the lateral plane refers to the width of a wafer plane occupied thereby.

Step V. A selective Co layer is formed on the TiN layer at the bottom of the first contact and on the Co layer at the bottom of the second contact respectively.

Furthermore, in this embodiment of the present disclosure, the selective Co layer is formed on the TiN layer at the bottom of the first contact and on the Co layer at the bottom of the second contact respectively in step V using a selective deposition method.

Furthermore, in this embodiment of the present disclosure, the selective Co layer formed on the TiN layer at the bottom of the first contact in step V is used to protect the TIN layer at the bottom of the first contact from damage and to avoid high resistance phenomena.

Furthermore, in this embodiment of the present disclosure, the selective Co layer is formed on the TiN layer at the bottom of the first contact and on the Co layer at the bottom of the second contact respectively in step V in the same process.

Figure 2:
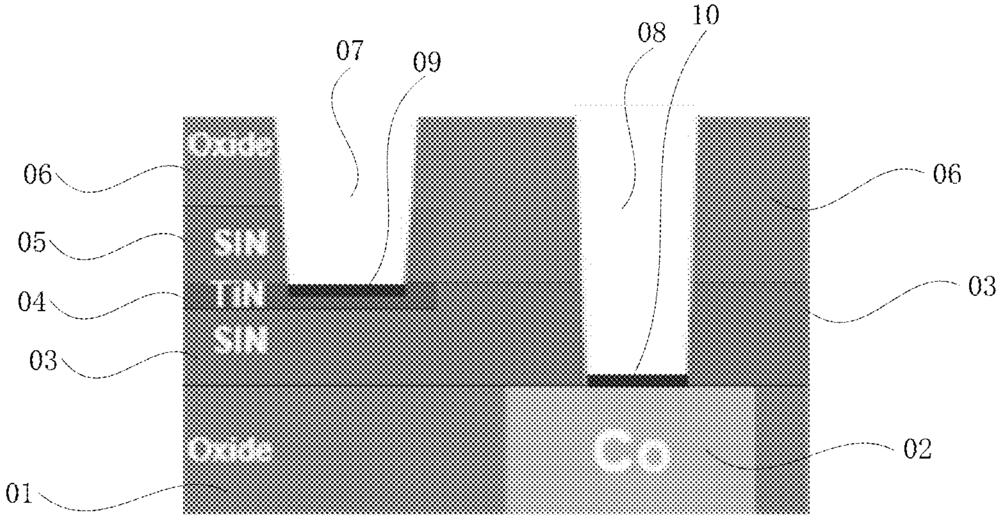
FIG. 2 illustrates a schematic diagram of a structure in which a selective Co layer is formed at bottoms of the first contact and the second contact in the present disclosure.

Referring to FIG. 2, FIG. 2 illustrates a schematic diagram of a structure in which the selective Co layer is formed at bottoms of the first contact and the second contact in the present disclosure. In step V, the selective Co layer is formed on the TiN layer 04 at the bottom of the first contact 07 and on the Co layer 02 at the bottom of the second contact 08 respectively. In this embodiment, the selective Co layer is formed on the TiN layer 04 at the bottom of the first contact 07 and on the Co layer 02 at the bottom of the second contact 08 respectively in step V using the selective deposition method, wherein the selective Co layer 09 is formed on the TIN layer 04 at the bottom of the first contact 07, and the selective Co layer 10 is formed on the Co layer 02 at the bottom of the second contact 08. In this embodiment, the selective Co layer 09 formed on the TiN layer 04 at the bottom of the first contact 07 in step V is used to protect the TiN layer 04 at the bottom of the first contact 07 from damage and to avoid the high resistance phenomena. In this embodiment, the selective Co layer is formed on the TiN layer 04 at the bottom of the first contact 07 and on the Co layer 02 at the bottom of the second contact 08 respectively in step V in the same process.

Step VI. The first contact and the second contact are filled with tungsten respectively.

Furthermore, in this embodiment of the present disclosure, the first contact and the second contact are filled with tungsten respectively in step VI using a selective deposition method.

Figure 3:
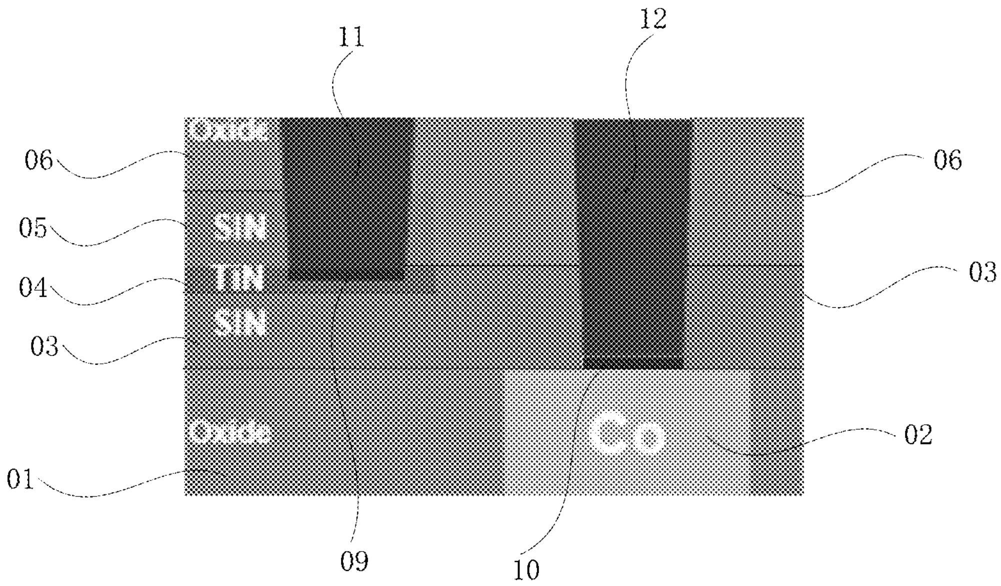
FIG. 3 illustrates a schematic diagram of a structure in which the first contact and the second contact are filled with tungsten respectively in the present disclosure.

Referring to FIG. 3, FIG. 3 illustrates a schematic diagram of a structure in which the first contact and the second contact are filled with tungsten respectively in the present disclosure. In step VI, the first contact and the second contact are filled with tungsten respectively. In this embodiment, the first contact and the second contact are filled with tungsten respectively in step VI using a selective deposition method. The first contact is filled with tungsten 11, and the second contact is filled with tungsten 12.

Since a growth mechanism of the selective Co is an electron donor, a TiN surface at the bottom of the high resistance trench and a Co surface at the bottom of the metal trench may both provide free electrons for the growth of Co molecules, without growing on the surface of a SiN dielectric layer and silicon oxide. Therefore, in a selective tungsten process, before the growth of the selective tungsten, a thin layer of selective Co is grown on the TiN surface, so that during the growth of selective tungsten, the high resistance trench and the metal layer trench both have Co films at bottoms thereof, thereby achieving the condition for the selective growth of tungsten and solving the problem that selective tungsten cannot be grown in the high resistance trench. Regarding the pretreatment, there is no need to take into account a loss of TiN, so that the process is more tunable. Regarding the integration, only a thin film deposition step is added, which has a small impact. The process for the selective tungsten is implementable, greatly reducing a contact resistance, and improving device performance.

To sum up, the present disclosure solves the problem that selective tungsten cannot be grown in a high resistance trench. Regarding the pretreatment, there is no need to take into account a loss of TiN, so that the process is more tunable. Regarding the integration, only a thin film deposition step is added, which has a small impact. The selective tungsten can be formed, greatly reducing the contact V0 resistance, and improving device performance. Therefore, the present disclosure effectively overcomes various defects in the prior art and has high industrial utilization value.

The above embodiments merely illustrate the principle and effect of the present disclosure, rather than limiting the present disclosure. Any person skilled in the art can modify or change the above embodiments without departing from the spirit and scope of the present disclosure. Therefore, all equivalent modifications or changes made by those with ordinary knowledge in the art without departing from the spirit and technical idea disclosed in the present disclosure shall still be covered by the claims of the present disclosure.

What is claimed is:

1. A contact filling method, at least comprising:

step I, providing a first oxide layer, wherein a Co layer embedded in the first oxide layer is formed on one side of the first oxide layer, and the Co layer penetrates through upper and lower surfaces of the first oxide layer; forming a stack layer on upper surfaces of the first oxide layer and the Co layer, wherein the stack layer comprises a first SiN layer, a TiN layer, and a second SiN layer in sequence from bottom to top;

step II, removing the second SiN layer and the TiN layer above the first oxide layer on one side provided with the Co layer by etching, and then covering, with the second oxide layer, the second SiN layer above the first oxide layer on one side provided with no Co layer and the first SiN layer on the side of the first oxide layer that is provided with the Co layer;

step III, removing the second oxide layer and the second SiN layer above the first oxide layer on the side provided with no Co layer by development etching, until an upper surface of the TiN layer is exposed, so as to form a first contact, wherein the TiN layer acts as the bottom of the first contact, and the diameter of the first contact is less than the width of the first oxide layer;

step IV, removing the second oxide layer and first SiN layer above the first oxide layer on the side provided with the Co layer by development etching, until the upper surface of the Co layer is exposed, so as to form a second contact, wherein the diameter of the second contact is less than the width of the Co layer;

step V, forming a selective Co layer on the TiN layer at the bottom of the first contact and on the Co layer at the bottom of the second contact respectively; and step VI, filling the first contact and the second contact with tungsten respectively.

2. The contact filling method according to claim 1, wherein the width of the first oxide layer in step II is a width in a lateral plane.

3. The contact filling method according to claim 1, wherein the width of the Co layer in step IV is a width in a lateral plane.

4. The contact filling method according to claim 1, wherein the selective Co layer is formed on the TiN layer at the bottom of the first contact and on the Co layer at the bottom of the second contact respectively in step V using a selective deposition method.

5. The contact filling method according to claim 1, wherein the first contact and the second contact are filled with tungsten respectively in step VI using a selective deposition method.

6. The contact filling method according to claim 1, wherein the selective Co layer formed on the TiN layer at the bottom of the first contact in step V is used to protect the TiN layer at the bottom of the first contact from damage and to avoid a high resistance phenomena.

7. The contact filling method according to claim 1, wherein the selective Co layer is formed on the TiN layer at the bottom of the first contact and on the Co layer at the bottom of the second contact respectively in step V in the same process.

* * * * *